(12) United States Patent
Hwang et al.

(10) Patent No.: US 6,664,028 B2
(45) Date of Patent: Dec. 16, 2003

(54) METHOD OF FORMING OPENING IN WAFER LAYER

(75) Inventors: Jiunn-Ren Hwang, Hsinchu (TW); I-Hsiung Huang, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 249 days.

(21) Appl. No.: 09/729,575

(22) Filed: Dec. 4, 2000

(65) Prior Publication Data

US 2002/0068243 A1 Jun. 6, 2002

(51) Int. Cl.[7] .................................................. G03C 5/56
(52) U.S. Cl. ........................ 430/312; 430/313; 430/317; 430/318; 430/330; 430/311
(58) Field of Search ............................... 430/312, 313, 430/317, 318, 330, 311

(56) References Cited

U.S. PATENT DOCUMENTS 5,667,940 A * 9/1997 Hsue et al. ................. 430/312
5,955,244 A * 9/1999 Duval ........................ 430/314
6,184,151 B1 * 2/2001 Adair et al. ................ 438/743
2001/0028442 A1 * 10/2001 Fukuda et al. ............... 355/27

* cited by examiner

Primary Examiner—Mark F. Huff
Assistant Examiner—Daborah Chacko-Davis
(74) Attorney, Agent, or Firm—J. C. Patents

(57) ABSTRACT

A method of forming an opening in a wafer layer. At least two patterned photoresist layers are formed on a wafer layer. Using different photoresist layers, many openings are defined. The wafer layer is then etched to form the opening. Each photoresist layer has a parallel linear pattern such as parallel strips or an array of rectangular blocks. The photoresist layers are superposed in a way that spaces between the patterns for each photoresist layers overlapped with each other for form openings that expose the underlying wafer layers. The wafer layer exposed in the openings is then etched to form contact/via holes without rounded corners while the rounded profiles has been cancelled by the superposition of the photoresist layers.

20 Claims, 4 Drawing Sheets

METHOD OF FORMING OPENING IN WAFER LAYER

BACKGROUND OF THE INVENTION

1. Field of the Invention

The invention relates in general to a photolithography and etching process of a semiconductor fabrication process. More particularly, this invention relates to a method of forming an opening in a wafer layer.

2. Description of the Related Art

As the dimension of a semiconductor device becomes smaller and smaller, techniques such as phase shift mask (PSM) or optical proximity correction (OPC) mask has to be used to improve the transferred pattern from a photomask during the exposure process. However, when the pattern dimension is smaller than a half of the wavelength of the light source, the diffraction effect becomes significant. Especially for the photoresist layer patterns of contact hole/via hole, the profile cannot be effective improved using the phase shift mask.

On the other hand, as some fine correction of the photomask pattern is required for optical proximity effect, the fabrication of the photomask is tedious. When the pitch of the pattern is too small, there is no space for forming the assistant feature on the photomask. As a result, the photoresist layer pattern may be formed with a rounded profile. The resultant opening in the wafer layer is thus very likely to be rounded. The exact shape, cross sectional area and resistance of the contact hole/via hole are difficult to control.

SUMMARY OF THE INVENTION

A method of forming an opening in a wafer layer. At least two patterned photoresist layers are formed on a wafer layer. Using different photoresist layers, many openings are defined. The wafer layer is then etched to form the opening. Each photoresist layer has a parallel linear pattern such as parallel strips or an array of rectangular blocks. The photoresist layers are superposed in a way that spaces between the patterns for each photoresist layers overlapped with each other for form openings that expose the underlying wafer layers. The wafer layer exposed in the openings is then etched to form contact/via holes without rounded corners while the rounded profiles has been cancelled by the superposition of the photoresist layers.

Both the foregoing general description and the following detailed description are exemplary and explanatory only and are not restrictive of the invention, as claimed.

BRIEF DESCRIPTION OF THE DRAWINGS

FIG. 1A to FIG. 1C shows a first embodiment of the invention, wherein FIG. 1C is a cross sectional view along the cutting line I–I' of FIG. 1B; and FIG. 2A to FIG. 2C shows a second embodiment of the invention, wherein

DESCRIPTION OF THE PREFERRED EMBODIMENTS

First Embodiment

Figure 1A:
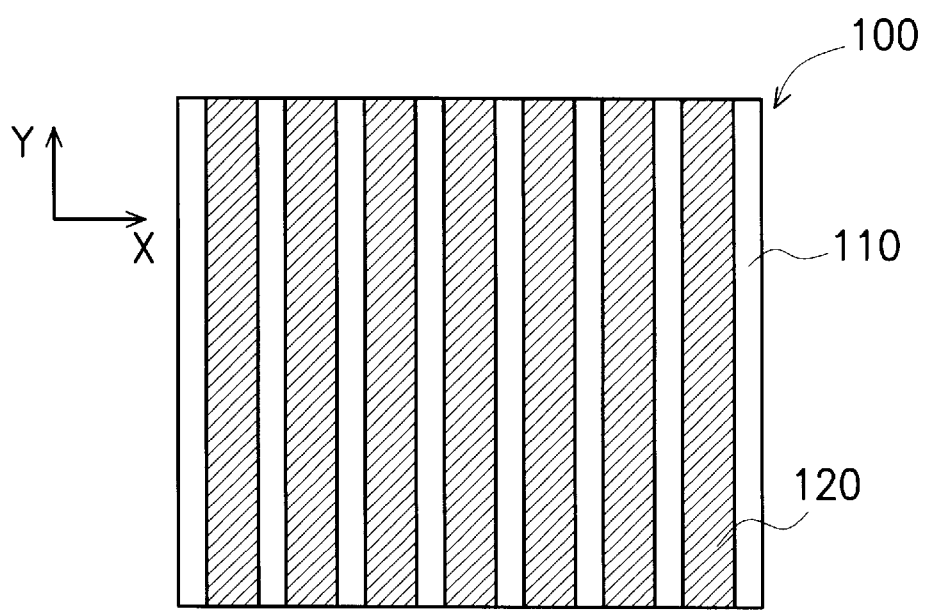
Figure 1B:
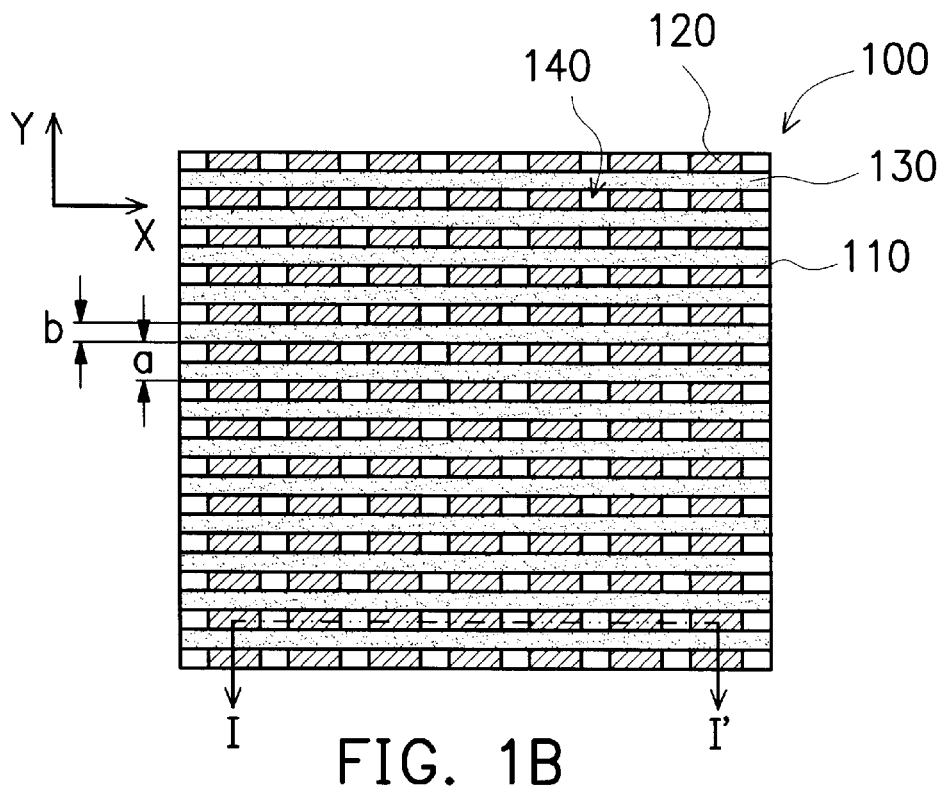
Figure 1C:
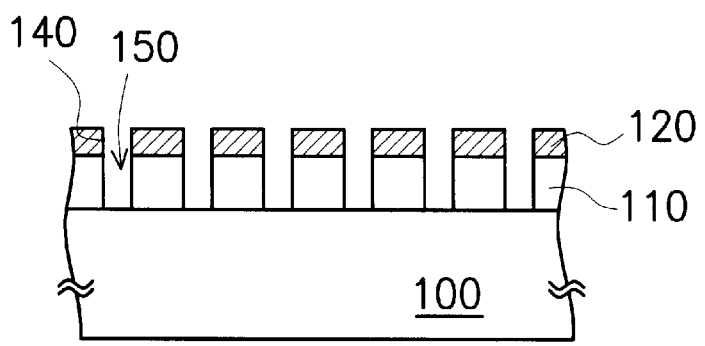

FIG. 1A to FIG. 1C shows a first embodiment of the invention. In the first embodiment, a method of forming an opening in an insulation layer using two patterned photoresist layers is illustrated.

In FIG. 1A, a substrate 100 is provided. An insulation layer 110 is formed on the substrate 100. The substrate includes a substrate for fabricating a dynamic random access memory (DRAM) thereon. For example, a metal oxide semiconductor (MOS) used as a memory is formed on the substrate 100 and requires a conductive line for electrical connection. A first photolithography and etching step is performed to form a patterned photoresist layer 120 with parallel strips spaced from each other with a pitch/size. In this embodiment, a negative photoresist layer is used. A KrF excimer laser generating a light source with wavelength of about 248 nm is used as the exposure machine, for example. The process for forming this patterned negative photoresist layer 120 includes the follow steps. A negative photoresist layer is coated on the insulation layer 110. Using the exposure light source and a photomask, the negative photoresist layer is exposed. A post exposure bake (PEB) step is performed, followed by a development.

In FIG. 1B, another patterned photoresist layer 130 in a form of a plurality of parallel strips spaced from each with a pitch/size is formed on the patterned photoresist layer 120. In this embodiment, a positive photoresist layer is selected for forming the patterned photoresist layer 130. As shown in FIG. 1B, as the parallel of the photoresist layers 120 and 130 are perpendicular to each other, openings 140 are defined penetrating through both the photoresist layers 120 and 130. That is, the openings 140 are defined by the overlapping spaces between the parallel strips of the first and the second photoresist layers. Again, a KrF excimer laser with a wavelength of about 248 nm is used as the exposure light source. Assuming that the width of each of the parallel strips of the photoresist layer 130 "b" is 0.1 micron, and the pitch between these parallel strips "a" is 0.2 micron along the Y direction, the width of each opening 140 is 0.1 micron (about ½ of the wavelength). The steps for forming the patterned photoresist layer 130 are similar to those for forming the patterned photoresist layer 120. In addition, as the patterned photoresist layer 120 is formed by cross-linking polymer, it is not affected by the exposure and development steps of the patterned photoresist layer 130.

In FIG. 1C, a cross sectional view along the cutting line I–I' in FIG. 1B is shown. Using the patterned photoresist layers 120 and 130 as a mask, the insulation layer 110 is etched to form the contact holes/via holes 150.

In this embodiment, using two photoresist layer steps, two photoresist layers with parallel strip pattern perpendicular to each other are formed. Since these two photoresist layers are formed with precise patterns as expected, the patterned of openings transferred thereby thus is correct and precise without a rounded profile.

In addition, the openings are defined by forming two photoresist layers in two photolithography and etching steps. When the aspect ratio of the openings in the photoresist layers is not equal to 1, or the pitch and width is not the same, the exposure conditions of each photolithography etching steps can be adjusted to obtain an opening with a precise critical dimension (CD). The pattern of each photoresist layers can also be adjusted to obtain a precise critical dimension.

Second Embodiment

Figure 2A:
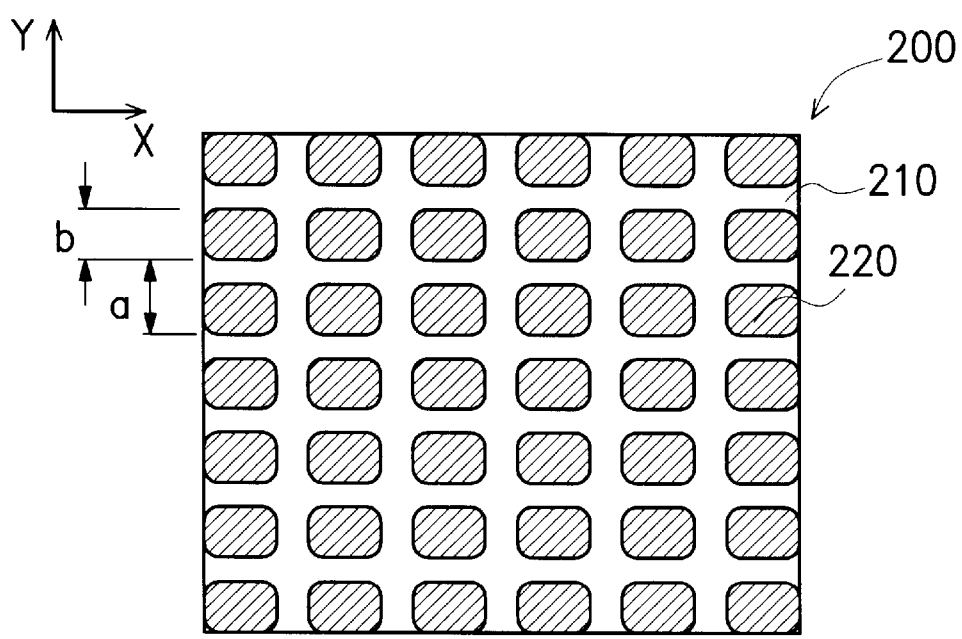
FIG. 2C is a cross sectional view along the cutting line II–II' of FIG. 2B.
Figure 2B:
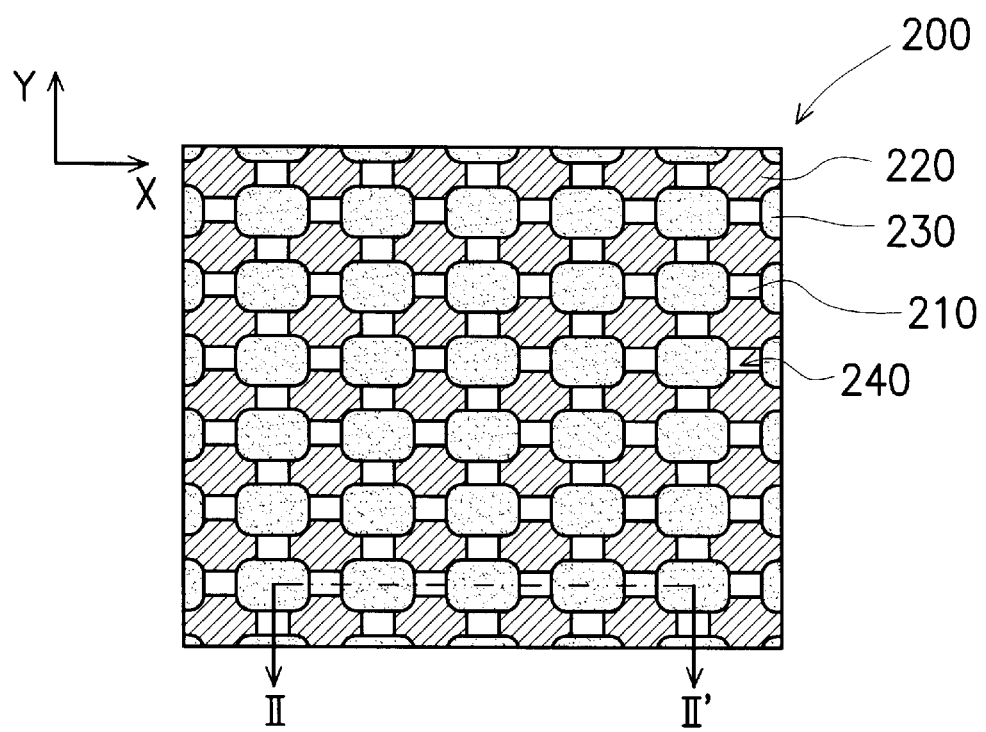
Figure 2C:
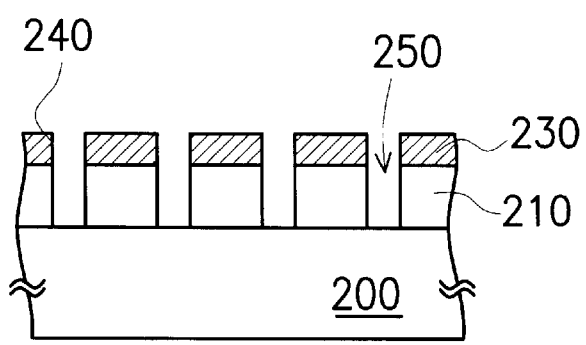

FIG. 2A to FIG. 2C shows a second embodiment of the invention. In the second embodiment, a method of forming an opening in an insulation layer using two patterned photoresist layers is illustrated.

In FIG. 2A, a substrate 200 is provided. An insulation layer 210 is formed on the substrate 200. The substrate includes a substrate for fabricating a dynamic random access memory (DRAM) thereon. For example, a metal oxide semiconductor (MOS) used as a memory is formed on the substrate 200 and requires a conductive line for electrical connection. A first photolithography and etching step is performed to form a photoresist layer 120 with a pattern of an array of blocks, for example, rectangular blocks. In this embodiment, a negative photoresist layer is used. Due to the diffraction of the exposure light, the corners of each block is rounded. A KrF excimer laser generating a light source with wavelength of about 248 nm is used as the exposure machine, for example. Along the Y direction, the pitch of the pattern "a" is about 0.3 micron, while the width of each block "b" is about 0.2 micron. The process for forming this patterned negative photoresist layer 220 includes the follow steps. A negative photoresist layer is coated on the insulation layer 210. A soft bake step is performed to reduce the solvent amount in the negative photoresist layer. Using the exposure light source and a photomask, the negative photoresist layer is exposed. A post exposure bake (PEB) step is performed, followed by a development.

In FIG. 2B, another photoresist layer 230 with a pattern of an array of blocks, preferably, the rectangular blocks, is formed on the photoresist layer 220. In this embodiment, the photoresist layer 230 is selected from a positive photoresist material. The array of blocks of the photoresist layer 230 is staggered with the array of blocks of the photoresist layer 220, so that openings 240 are defined penetrating through the photoresist layers 220 and 230. Again, due to the diffraction effect of the exposure light, rounded patterned is resulted for the photoresist layer 230.

Assuming that the length and pitch in X direction are the same as the width and pitch in Y direction for both the photoresist layers 220 and 230, and each block of the photoresist layer 230 overlying the center four neighboring blocks of the photoresist layer 220, openings 240 are formed without rounded corners as shown in FIG. 1B. This is because that the width of the blocks is larger than the pitch, and the openings 240 defined by the pitches of the superposing photoresist layers 220, 230 have width and length smaller than the blocks. The rounded corners of the photoreist layers 220 and 230 overlap with each other can are thus eliminated with each other.

FIG. 2C shows a cross sectional view of the openings 240 along the cutting line II–II' of FIG. 2B. Using the photoresist layers 220 and 230, the insulation layer 210 is etched to form the contact hole/via holes 250. As the openings 240 are defined by the straight lines of the sides of four staggering neighboring blocks of the photoresist layers 220 and 230, the openings 240 are thus formed with rectangular shapes without rounded corners.

In this embodiment, two photoresist layers with patterns of blocks are formed. Though the blocks are formed with rounded corners. These corners are eliminated with each other by superposing the photoresist layers in a staggered way. As a result, a contact/via hole with a rectangular pattern and without rounded corner. The shape, cross sectional area and resistance can thus be precisely controlled.

The application can be applied to formation of trench capacitor of a dynamic random access memory since the bottom electrode of the trench capacitor is formed by forming an insulation layer first, followed by forming an opening in the insulation opening. A bottom electrode plate is further formed in the opening. This is very similar to the formation of a contact/via hole.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming an opening in a wafer layer on a substrate, comprising:

forming a first photoresist layer with a plurality of first linear patterns spaced with each other with a first pitch on the wafer layer;

forming a second photoresist layer with a plurality of second linear patterns spaced with each other with a second pitch, wherein a material of the second photoresist layer is different from a material of the first photoresist layer; and wherein the second photoresist layer is formed on the first photoresist layer in a way that the second linear patterns are perpendicularly crossing over the first linear patterns, such that the openings are formed penetrating through the first and the second photoresist layers by superposition of the spaces between the first and second linear patterns;

forming a plurality of contact/via holes in the wafer layer by removing the wafer layer exposed by the openings.

2. The method according to claim 1, wherein the contact/via holes are formed with a width between a wavelength of exposure light used for forming the first and the second photoresist layers.

3. The method according to claim 1, wherein the wafer layer is formed on a substrate used for fabricating a dynamic random access memory, the wafer layer comprises an insulation layer, and the openings comprise contact windows.

4. The method according to claim 1, wherein the substrate used for forming a dynamic random access memory thereon comprises a plurality of conductive wires for electrical connection, the wafer layer includes an insulation layer, and the openings are used for forming contact windows.

5. The method according to claim 1, wherein the substrate is used for forming a dynamic random access memory thereon, wherein a plurality of node contact windows are formed on the substrate, the wafer comprises an insulation layer, the node contacts are exposed by each of the openings, and the openings are used for forming a plurality of bottom electrodes of capacitors.

6. The method according to claim 1, wherein the first photoresist layer is not affected while patterning the first photoresist layer in a development process, the first photoresist layer/second photoresist layer comprises negative photoresist layer/positive photoresist layer and positive photoresist layer/negative photoresist layer.

7. The method according to claim 1, wherein the first photoresist layer comprises a first pattern pitch/size, the second photoresist layer comprises a second pattern pitch/size, and the first pattern pitch/size is different from the second pattern pitch/size, and the exposure conditions for forming the first and the second photoresist layers are adjusted according to the first and second pattern pitches/sizes.

8. The method according to claim 7, wherein the first and the second pattern sizes/pitches have a first and a second width, respectively, and the first and the second sizes are equal to each other.

9. A method of forming an opening in a wafer layer on a substrate, comprising:

forming a first photoresist layer with a pattern of an array of a plurality of first blocks on the wafer layer;

forming a second photoresist layer with a pattern of an array of a plurality of second blocks on the first photoresist layer, wherein the second blocks are staggered on the first blocks, so that a plurality openings are formed penetrating through the first and the second photoresist layers to expose the wafer layer; and etching the wafer layer exposed by the openings.

10. The method according to claim 9, wherein contact/via holes are formed with a width between the wavelength and ½ of the wavelength of an exposure light after etching the wafer layer.

11. The method according to claim 9, wherein the first blocks and the second blocks are rectangular blocks with four rounding corners, and each of the second blocks is superposed on a space between four neighboring first blocks and covers four neighboring rounding corners of the four neighboring first blocks.

12. The method according to claim 11, wherein the substrate is used for forming a dynamic random access memory, the substrate comprises a plurality of conductive wires for electrical connection, the wafer layer comprises an insulation layer, and the openings comprise a plurality of vias.

13. The method according to claim 9, wherein the substrate is used for forming a dynamic random access memory, the substrate comprises a plurality of metal-oxide semiconductors, the wafer layer includes an insulation layer, and the openings include contact windows.

14. The method according to claim 9, wherein the substrate is used for forming a dynamic random access memory, the substrate comprises a plurality of node contact windows, and the wafer layer includes an insulation layer, wherein the node contact windows are exposed by each opening, and the openings are used for forming a plurality of bottom electrode plates of capacitors.

15. The method according to claim 9, herein each of the first block has a same dimension as each of the second block, a center of each first block is located at a center of four neighboring second blocks, a center of each second block is located at a center of four neighboring first blocks.

16. The method according to claim 9, wherein the first photoresist layer is not affected in a development process for patterning the second photoresist layer, and the first photoresist layer/second photoresist layer is in a form of negative photoresist layer/negative photoresist layer, negative photoresist layer/positive photoresist layer, and positive photoresist layer/negative photoresist layer.

17. A method of forming an opening in a wafer layer on a substrate, comprising:

forming a first photoresist layer with at least two adjacent first rectangular blocks on the wafer layer, wherein the two adjacent first rectangular blocks with four rounding corners are laid in a first direction;

forming a second photoresist layer with at least two adjacent second rectangular blocks on the first photoresist layer, wherein the two adjacent second rectangular blocks with four rounding corners are laid in a second direction orthogonal to the first direction, and first adjacent rounding corners of the two adjacent first rectangular blocks are covered by one of the two adjacent second rectangular blocks and second rounding adjacent corners of the two adjacent first rectangular blocks are covered by the other second rectangular block, so that at least one opening is formed to penetrate through the first and the second photoresist layers to expose the wafer layer; and etching the wafer layer exposed to by the opening.

18. The method according to claim 17, wherein each of the two first blocks has a same dimension as each of the two second blocks.

19. The method according to claim 18, wherein a center of the two first blocks is located at a center of the two second blocks.

20. The method according to claim 17, wherein the first photoresist layer is not affected in a development process for patterning the second photoresist layer, and the first photoresist layer/second photoresist layer is in a form of negative photoresist layer/negative photoresist layer, negative photoresist layer/positive photoresist layer, and positive photoresist layer/negative photoresist layer.

* * * * *